(12) United States Patent
Weaver

(10) Patent No.: US 8,569,744 B2
(45) Date of Patent: Oct. 29, 2013

(54) OLED DISPLAY ARCHITECTURE

(75) Inventor: Michael S. Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 913 days.

(21) Appl. No.: 12/639,541

(22) Filed: Dec. 16, 2009

(65) Prior Publication Data

US 2010/0244069 A1 Sep. 30, 2010

Related U.S. Application Data

(60) Provisional application No. 61/164,667, filed on Mar. 30, 2009.

(51) Int. Cl.
*H01L 51/52* (2006.01)

(52) U.S. Cl.
USPC .......................................................... 257/40

(58) Field of Classification Search
USPC ...................... 257/98, 40, 79–80, 99; 428/690
See application file for complete search history.

(56) References Cited

U.S. PATENT DOCUMENTS

| | | | |
|---|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |

(Continued)

FOREIGN PATENT DOCUMENTS

JP 2006004758 1/2006

OTHER PUBLICATIONS

International Search Report and Written Opinion corresponding to the PCT/US2009/068505 application.

(Continued)

*Primary Examiner* — Nathan Ha
(74) *Attorney, Agent, or Firm* — Morris & Kamlay LLP

(57) ABSTRACT

A device is provided. The device includes first, second and third subpixels. The first sub-pixel includes an emissive layer having a first emitting material but not a second emitting material. The second sub-pixel includes an emissive layer having the second emitting material but not the first emitting material. The third sub-pixel includes an emissive layer having both the first and second emitting materials. A method of fabricating the device is provided. For a three subpixel device, a first electrode layer is deposited, having a first sub-pixel and a second sub-pixel. Then, in a first patterned deposition process, a first emitting material is deposited on the first sub-pixel and the third sub-pixel, but not the second sub-pixel. Then, in a second patterned deposition process, a second emitting material is deposited on the second sub-pixel and the third sub-pixel, but not the first sub-pixel. Then, a second electrode layer is deposited. The first, second and third subpixels may be defined, for example, by patterning in either or both of the first and second electrode layers. Preferably, the device and method include a fourth subpixel.

18 Claims, 10 Drawing Sheets

(56) References Cited

U.S. PATENT DOCUMENTS

| | | |
|---|---|---|
| 6,468,819 B1 | 10/2002 | Kim et al. |
| 7,279,704 B2 | 10/2007 | Walters et al. |
| 7,973,319 B2 * | 7/2011 | Kashiwabara et al. ......... 257/79 |
| 8,040,055 B2 * | 10/2011 | Koo et al. ..................... 313/506 |
| 8,093,586 B2 * | 1/2012 | Shimoji et al. ................. 257/40 |
| 8,102,111 B2 * | 1/2012 | Maeda et al. ................. 313/503 |
| 8,338,222 B2 * | 12/2012 | Kim et al. ....................... 438/99 |
| 2002/0186214 A1 | 12/2002 | Siwinski |
| 2003/0230980 A1 | 12/2003 | Forrest et al. |
| 2004/0174116 A1 | 9/2004 | Lu et al. |
| 2006/0138418 A1 | 6/2006 | Lee et al. |
| 2007/0015429 A1 | 1/2007 | Maeda et al. |
| 2007/0102737 A1 * | 5/2007 | Kashiwabara et al. ....... 257/291 |
| 2007/0200495 A1 | 8/2007 | Kai et al. |
| 2007/0222367 A1 | 9/2007 | Hosoda et al. |
| 2009/0200544 A1 * | 8/2009 | Lee et al. ........................ 257/40 |
| 2009/0242911 A1 * | 10/2009 | Ishihara et al. ................. 257/89 |
| 2012/0175659 A1 * | 7/2012 | Yamazaki et al. .............. 257/98 |

OTHER PUBLICATIONS

Baldo et al., "Highly Efficient Phosphorescent Emission from Organic Electroluminescent Devices," Nature, vol. 395, 151-154, 1998.

Baldo et al., "Very high-efficiency green organic light-emitting devices based on electrophosphorescence," Appl. Phys. Lett., vol. 75, No. 3, 4-6 (1999).

U.S. Appl. No. 10/233,470, filed Sep. 4, 2002.

A. Arnold, T. K. Hatwar, M. Hettel, P. Kane, M. Miller, M. Murdoch, J. Spindler, S. V. Slyke, Proc. Asia Display (2004).

J. P. Spindler et al., "Lifetime- and power-enhanced RGBW displays based on white OLEDs," SID 2005 International Symposium Technical Digest 36, 1, pp. 36-39 (2005).

Du-Zen Peng, et al, "Challenges for small- and medium-sized AMOLED displays," Information Display 23, 2, pp. 12-18 (2007).

B-W. Lee et al. "Late-News Paper: TFT-LCD with RGBW Color System" SID 03 Digest, pp. 1212-1215 (2003).

* cited by examiner

OLED DISPLAY ARCHITECTURE

This application claims priority to and benefit under 35 U.S.C. §119(e) to U.S. Provisional Application No. 61/164,667, filed Mar. 30, 2009, the disclosures of which are herein expressly incorporated by reference in their entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and more specifically to the use of both light and deep blue organic light emitting devices to render color.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the structure of Formula I:

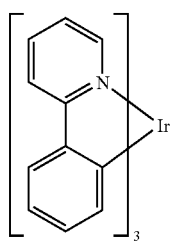

In this, and later figures, herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which Consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A device that may be used as a multi-color pixel is provided. The device has a first organic light emitting device, a second organic light emitting device, a third organic light emitting device, and a fourth organic light emitting device, that may be referred to as sub-pixels. The device may be a pixel of a display.

A device is provided. The device includes first, second and third subpixels. The first sub-pixel includes an emissive layer having a first emitting material but not a second emitting material. The second sub-pixel includes an emissive layer having the second emitting material but not the first emitting material. The third sub-pixel includes an emissive layer having both the first and second emitting materials.

A method of fabricating the device is provided. For a three subpixel device, a first electrode layer is deposited, having a first sub-pixel and a second sub-pixel. Then, in a first patterned deposition process, a first emitting material is deposited on the first sub-pixel and the third sub-pixel, but not the second sub-pixel. Then, in a second patterned deposition process, a second emitting material is deposited on the second sub-pixel and the third sub-pixel, but not the first sub-pixel. Then, a second electrode layer is deposited. The first, second and third subpixels may be defined, for example, by patterning in either or both of the first and second electrode layers.

Preferably, the device further includes a fourth sub-pixel, where at least one of the first and second electrode layers are patterned to define the first, second and third subpixels. A third patterned deposition process may be used to deposit a third emitting material on the fourth sub-pixel. During this third patterned deposition process, the third emitting material may or may not be deposited onto the third subpixel, depending upon whether it is desired to have the third subpixel have only the first and second emitting materials (for example, for light blue or orange-red emission), or to have the first, second and third emitting materials (for example, for white emission).

The first, second, third and fourth organic light emitting devices may have the same surface area, or may have different surface areas. The first, second, third and fourth organic light emitting devices may be arranged in a quad pattern, in a row, or in some other pattern.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
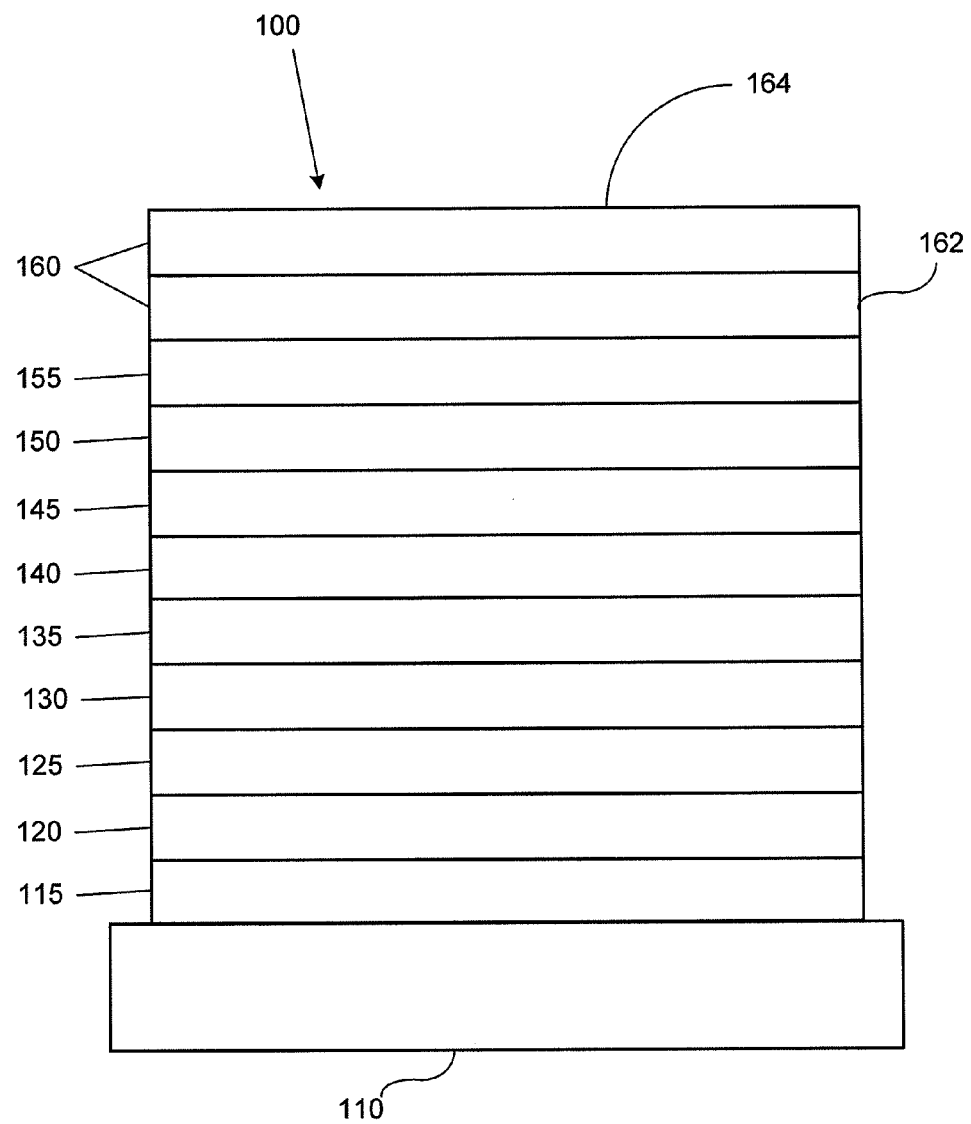
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_{.sub.4}$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
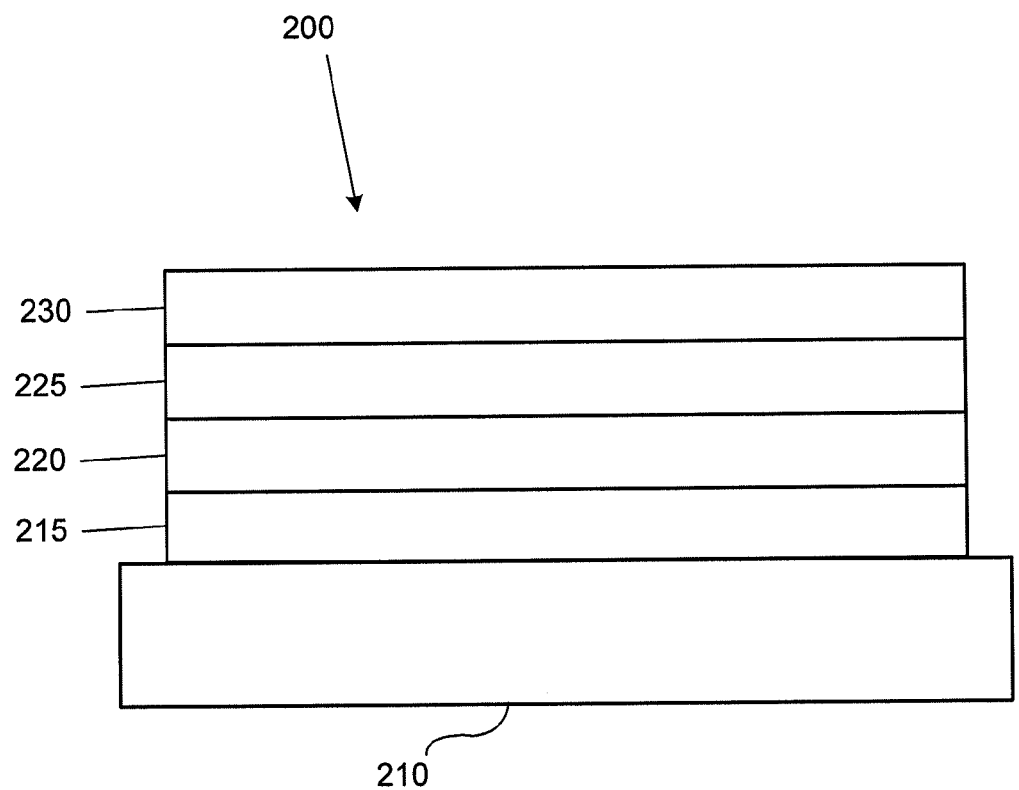
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

One pixel architecture is the RGBW architecture, where a pixel has four subpixels, specifically red, green, blue and white. Algorithms have been developed in conjunction with RGBW devices that may be used to map a RGB color to an RGBW color. Similar algorithms may be used to map an RGB color to RG B1 B2. Such algorithms, and RGBW devices generally, are disclosed in A. Arnold, T. K. Hatwar, M. Hettel, P. Kane, M. Miller, M. Murdoch, J. Spindler, S. V. Slyke, Proc. Asia Display (2004); J. P. Spindler, T. K. Hatwar, M. E. Miller, A. D. Arnold, M. J. Murdoch, P. J. Lane, J. E. Ludwicki and S. V. Slyke, SID 2005 International Symposium Technical Digest 36, 1, pp. 36-39 (2005) ("Spindler"); Du-Zen Peng, Hsiang-Lun, Hsu and Ryuji Nishikawa. Information Display 23, 2, pp 12-18 (2007) ("Peng"); B-W. Lee, Y. I.

Hwang, H-Y, Lee and C. H. Kim, SID 2008 International Symposium Technical Digest 39, 2, pp. 1050-1053 (2008).

Figure 3:
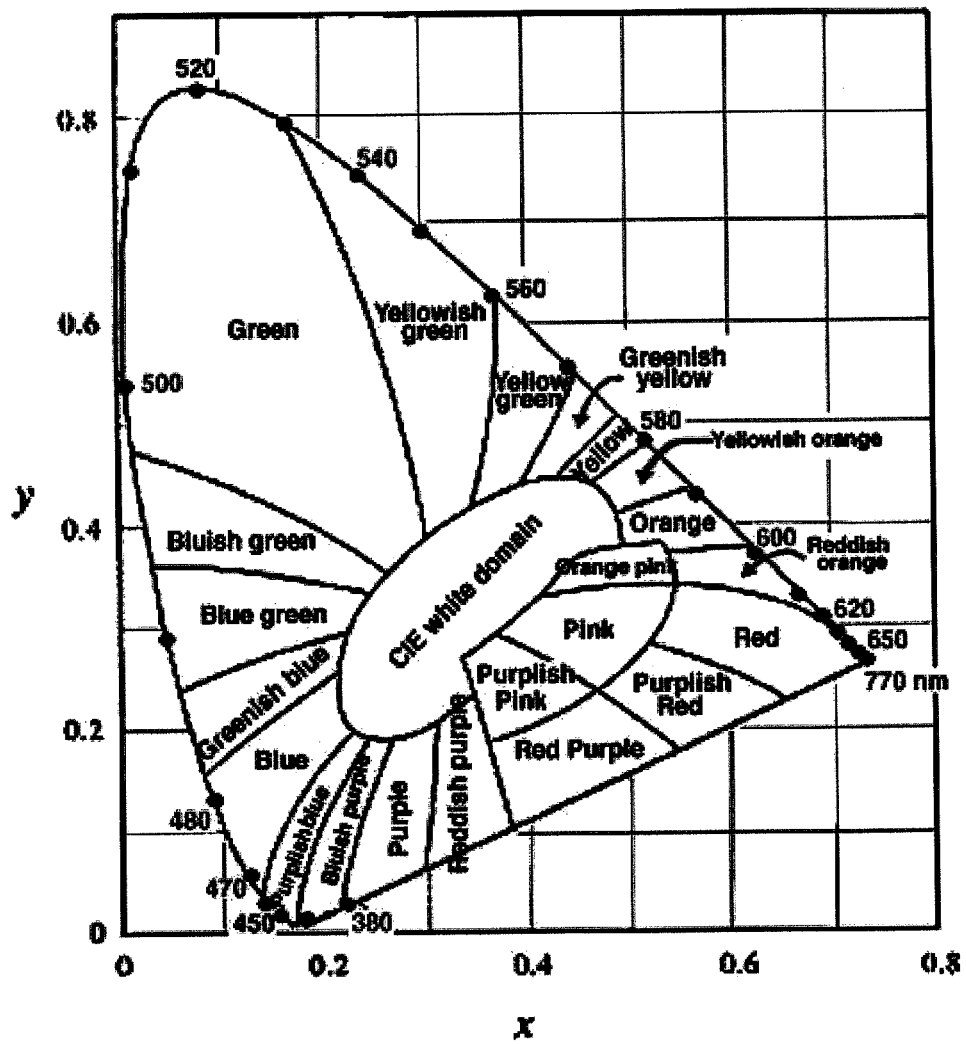
FIG. 3 shows a rendition of the 1931 CIE chromaticity diagram.

FIG. 3 shows the 1931 CIE chromaticity diagram, developed in 1931 by the International Commission on Illumination, usually known as the CIE for its French name Commission Internationale de l'Eclairage. Any color can be described by its x and y coordinates on this diagram. A "saturated" color, in the strictest sense, is a color having a point spectrum, which falls on the CIE diagram along the U-shaped curve running from blue through green to red. The numbers along this curve refer to the wavelength of the point spectrum. Lasers emit light having a point spectrum.

Figure 4:
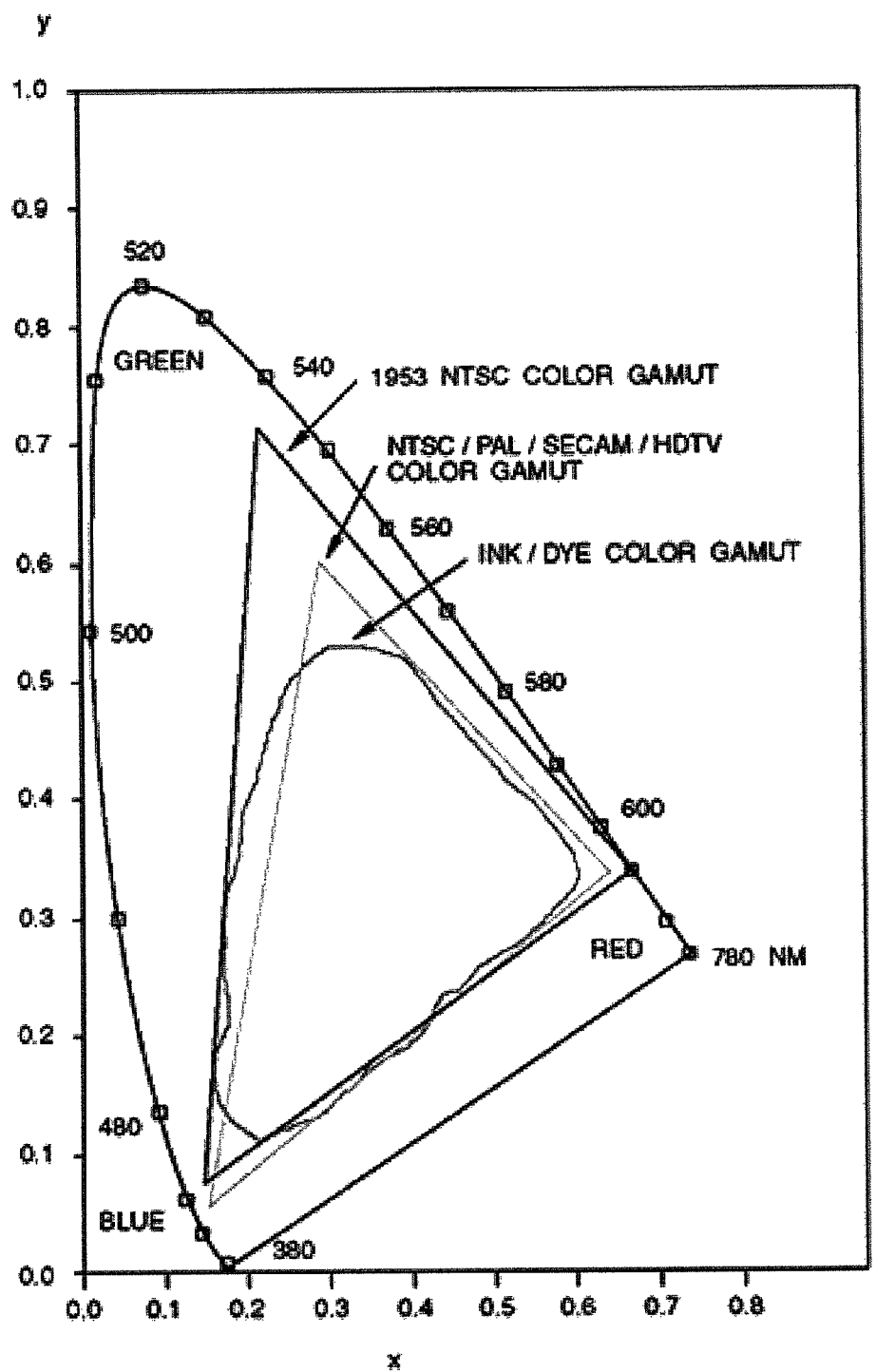
FIG. 4 shows a rendition of the 1931 CIE chromaticity diagram that also shows color gamuts.

FIG. 4 shows another rendition of the 1931 chromaticity diagram, which also shows several color "gamuts." A color gamut is a set of colors that may be rendered by a particular display or other means of rendering color. In general, any given light emitting device has an emission spectrum with a particular CIE coordinate. Emission from two devices can be combined in various intensities to render color having a CIE coordinate anywhere on the line between the CIE coordinates of the two devices. Emission from three devices can be combined in various intensities to render color having a CIE coordinate anywhere in the triangle defined by the respective coordinates of the three devices on the CIE diagram. The three points of each of the triangles in FIG. 4 represent industry standard CIE coordinates for displays. For example, the three points of the triangle labeled "NTSC/PAL/SECAM/HDTV gamut" represent the colors of red, green and blue (RGB) called for in the sub-pixels of a display that complies with the standards listed. A pixel having sub-pixels that emit the RGB colors called for can render any color inside the triangle by adjusting the intensity of emission from each subpixel.

RGBW devices are favored in some contexts because they may have better power efficiency than a comparable RGB device.

However, a conventional approach to fabricating an RGBW device would involve more patterning steps than fabricating an RGB device, due to the presence of the fourth (white) device. Because every extra patterning step, and every extra material involved in patterning, can add significantly to the cost of fabrication, these additional patterning steps and materials are a potentially significant drawback to the RGBW approach. Note that the cost associated with an additional material is not merely the cost of the material itself. Every time a manufacturing system is called upon to deposit an additional material, there may be issues associated with whether the manufacturing system has the capability to handle an extra material, how difficult it is to add extra capability, and contamination issues.

A device architecture, and a method of fabricating the architecture, are provided that mitigate these drawback to the RGBW approach. The device architecture provides an RGBW device in which the emitting materials in the white device are a combination of red, green and blue emitting materials from the red, green and blue devices. As a result, the inclusion of a white device may not necessitate the use of extra materials, with the associated cost issues. The method further provides a way to fabricate the white device while minimizing or eliminating patterning steps in addition to those already used for the red, green and blue devices.

More generally, the architecture and method may relate to a device having three subpixels, where the emitting materials in the third subpixel are a combination of the emitting materials from the first and second subpixels. The use of the architecture and method in the RGBW context is a specific use of this more general concept.

A device is provided. The device includes first, second and third subpixels. The first sub-pixel includes an emissive layer having a first emitting material but not a second emitting material. The second sub-pixel includes an emissive layer having the second emitting material but not the first emitting material. The third sub-pixel includes an emissive layer having both the first and second emitting materials.

The device may also include a fourth subpixel including an emissive layer having a third emitting material. In some embodiments, the emissive layer of the third subpixel may also include the third emissive material. In some embodiments, the emissive layer of the third subpixel does not include the third emissive material.

There are various preferred combinations for the spectra of light emitted by the various subpixels. For use in a display, it is generally preferred that the first, second and fourth subpixels each emit one of red, green and blue light that corresponds to a color gamut desired by the display industry, which may be conveniently designated by peak wavelength, or by CIE coordinates, and the fourth subpixel emits light resulting from a combination of two or three of the emitting materials present in the other subpixels, which is generally best described by CIE coordinates due to the breadth of spectrum and the possibility of multiple peaks due to multiple emitters. Possible useful combinations and emission spectra for the subpixel having a combination of emissive materials are white light from combining all three emissive materials, red/green light from combining red and green emissive materials, and blue/green light from combining blue and green emissive materials. Other combinations are also possible.

For example, this may mean that the first sub-pixel emits light having a peak wavelength of 400-470 nm, the second subpixel emits light having a peak wavelength of 500-600 nm, the third subpixel emits light having a 1931 CIE coordinate of (x=0.10-0.20, y=0.15-0.45) and the fourth subpixel emits light having a peak wavelength of 600-700 nm. The first, second and fourth subpixels may emit blue, green and red light, respectively, while the third sub-pixel emits light blue light that is a combination of the blue and green light. The third subpixel in this instance could be obtained, for example, by combining the emitting material from device 7 of Table 1 for the blue contribution, and the emitting material from device 1 or device 9 for the green contribution.

For example, this may mean that the first sub-pixel emits light having a peak wavelength of 600-700 nm, the second subpixel emits light having a peak wavelength of 500-600 nm, the third subpixel emits light having a 1931 CIE coordinate of (x=0.40-0.63, y=0.36-0.55) and the fourth subpixel emits light having a peak wavelength of 400-500 nm. The first, second and fourth subpixels may emit red, green and blue light, respectively, while the third sub-pixel emits orange-yellow light that is a combination of the red and green light. An example of materials that can be used to make such a third subpixel can be found in device 3 or device 4 of Table 1.

For example, this may mean that the first sub-pixel emits light having a peak wavelength of 400-500 nm, the second subpixel emits light having a peak wavelength of 500-600 nm, the third subpixel emits light having a 1931 CIE coordinate of (x=0.26-0.37, y=0.27-0.38) and the fourth subpixel emits light having a peak wavelength of 600-700 nm. The first, second and fourth subpixels may emit blue, green and red light, respectively, while the third sub-pixel emits white light that is a combination of the blue and green and red light. An example of materials that can be used to make such a third subpixel can be found in device 5 or device 8 of Table 1.

A method of fabricating the device is provided. For a three subpixel device, a first electrode layer is deposited, having a first sub-pixel and a second sub-pixel. Then, in a first patterned deposition process, a first emitting material is deposited on the first sub-pixel and the third sub-pixel, but not the second sub-pixel. Then, in a second patterned deposition process, a second emitting material is deposited on the second sub-pixel and the third sub-pixel, but not the first sub-pixel. Then, a second electrode layer is deposited. The first, second and third subpixels may be defined, for example, by patterning in either or both of the first and second electrode layers.

Preferably, the device further includes a fourth sub-pixel, where at least one of the first and second electrode layers are patterned to define the first, second and third subpixels. A third patterned deposition process may be used to deposit a third emitting material on the fourth sub-pixel. During this third patterned deposition process, the third emitting material may or may not be deposited onto the third subpixel, depending upon whether it is desired to have the third subpixel have only the first and second emitting materials (for example, for light blue or orange-red emission), or to have the first, second and third emitting materials (for example, for white emission).

Other layers may also be deposited, such as a first non-emitting organic layer deposited after the first electrode layer and before the first and second patterned deposition processes, and a a second non-emitting organic layer deposited after the first and second patterned deposition processes and before depositing the second electrode layer.

Due to the presence of the third subpixel, which includes a combination of emitting materials present in the other sub-pixels, three subpixels having different emission may be deposited using only two patterned deposition processes for the emissive layers. Similarly, four subpixels having different emission may be deposited using only three patterned deposition processes for the emissive layers.

FIGS. 5-9 illustrated a method of making a device having four subpixels, where the emitting materials in the one of the subpixels is a combination of the emitting materials from the other three subpixels.

Figure 5:
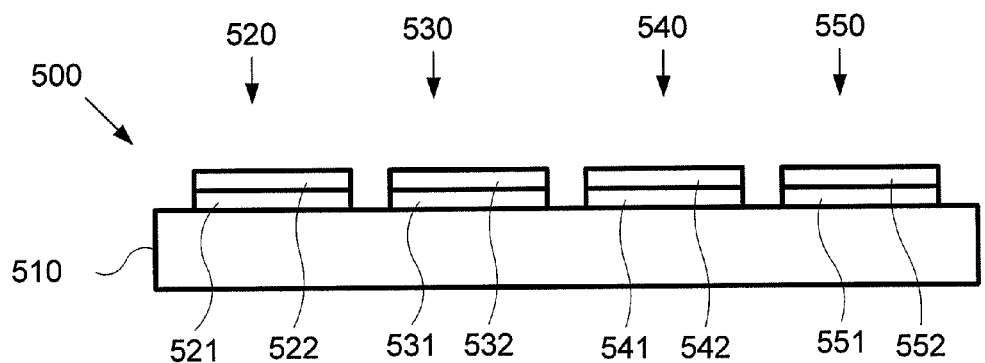
FIG. 5 shows a device 500 in a state of partial fabrication.

FIG. 5 shows device 500 in a state of partial fabrication. Device 500 has four subpixels, specifically first subpixel 520, second subpixel 530, third subpixel 540 and fourth subpixel 550. Device 500 is fabricated on a substrate 510. As illustrated in FIG. 5, each partially fabricated sub-pixel includes a first electrode and a first non-emissive organic layer. Specifically, devices 520, 530, 540 and 550 include first electrode 521, 531, 541 and 551, and first non-emissive organic layer 522, 532, 542 and 552, respectively. The first electrodes and first non-emissive layers may include any materials, and may be fabricated by any method. The first non-emissive layers are optional. When present, the first non-emissive layers may include one or more different sublayers. In a preferred embodiment, the first electrode is an anode, and the first non-emissive layers include one or more layers that are known for inclusion in an organic light emitting device between the anode and the emissive layer. Examples of such layers include a hole injection layer, a hole transport layer, and an electron blocking layer as described in FIG. 1. The first electrode may also be a cathode, as described, for example, with respect to FIG. 2, with corresponding adjustments to the first non-emissive organic layers. In a preferred embodiment, all of the first electrodes are fabricated simultaneously by the same method, and have the same composition, and all of the first non-emissive organic layers similarly have the same composition and are fabricated simultaneously. Having all of these layers the same across all subpixels allows for ease of fabrication, although some tradeoffs may need to be made in terms of device optimization as described in more detail below.

Figure 6:
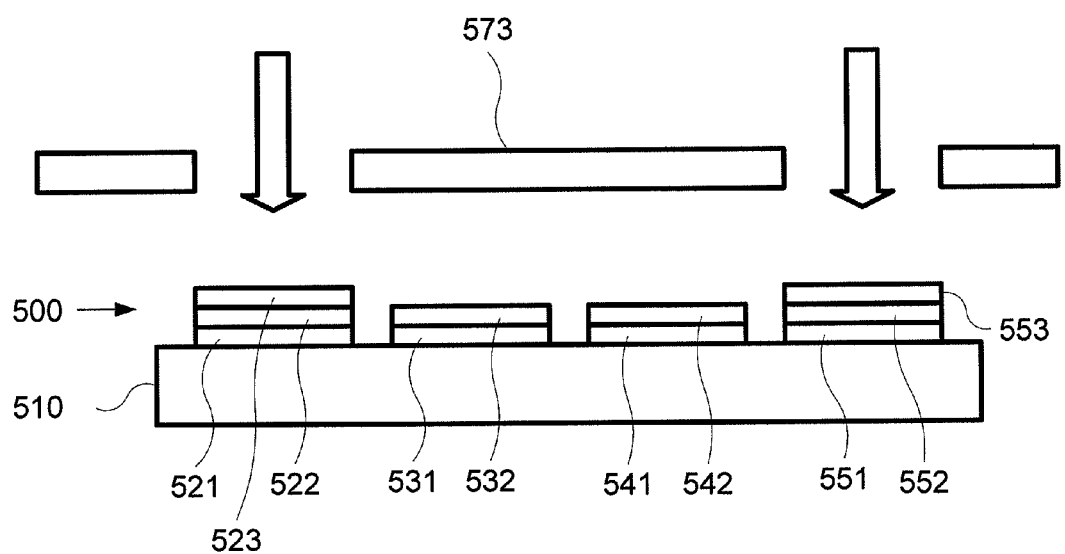
FIG. 6 shows device 500 in a state of partial fabrication, more progressed than illustrated in FIG. 5.

FIG. 6 shows device 500 in a state of partial fabrication, more progressed than illustrated in FIG. 5. FIG. 6 illustrates the addition of emissive layer 523 to subpixel 520, and the addition of emissive layer 553 to subpixel 550, simultaneously and through the same mask 573. As a result, emissive layer 523 and emissive layer 553 have the same composition. Emissive layers 523 and 553 both contain at least a first emitting material. Emissive layers 523 and 553 may also contain other materials that are known for use in an emissive layer, such as a host material, emitting materials in addition to the first emitting material, dopants included to enhance transport properties, sensitivity dopants, and other materials. Emissive layers 523 and 553 may have sublayers.

Figure 7:
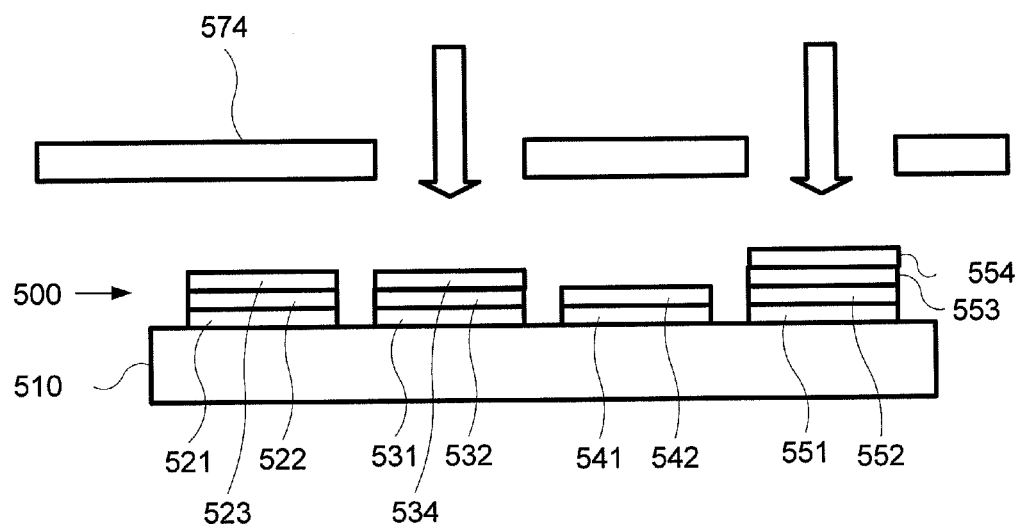
FIG. 7 shows device 500 in a state of partial fabrication, more progressed than illustrated in FIG. 6.

FIG. 7 shows device 500 in a state of partial fabrication, more progressed than illustrated in FIG. 5. FIG. 7 illustrates the addition of emissive layer 534 to subpixel 530, and the addition of emissive layer 554 to subpixel 550, simultaneously and through the same mask 574. As a result, emissive layer 534 and emissive layer 554 have the same composition. Emissive layers 534 and 554 both contain at least a second emitting material. Emissive layers 534 and 554 may also contain other materials that are known for use in an emissive layer, such as a host material, emitting materials in addition to the second emitting material, dopants included to enhance transport properties, sensitivity dopants, and other materials. Emissive layers 534 and 554 may have sublayers. In subpixel 550, emissive layer 554 is deposited over emissive layer 553, such that there are now two separate emissive layers in sub-pixel 550, emissive layer 553 that includes the first emissive material, and emissive layer 554 that includes the second emissive material.

Figure 8:
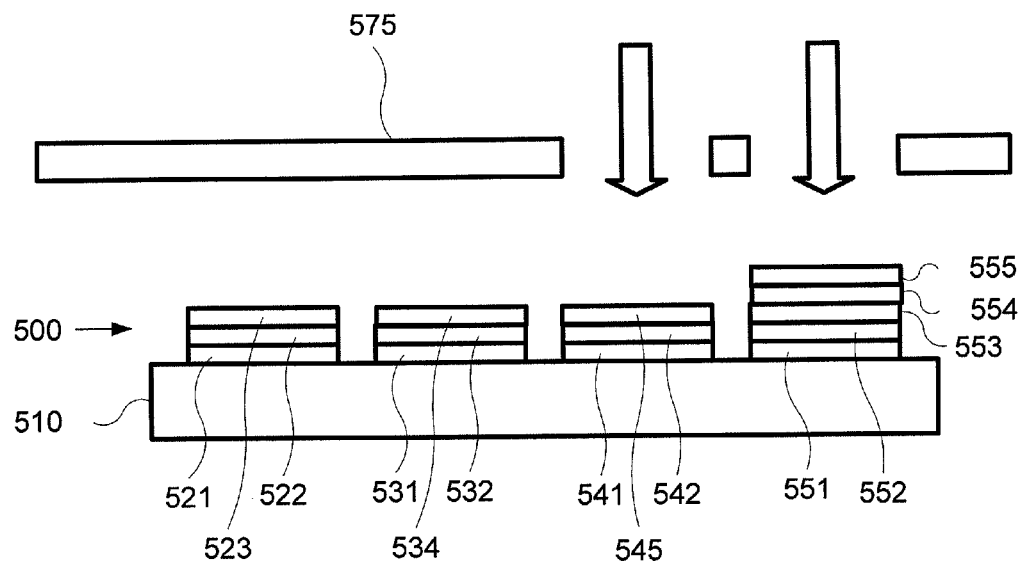
FIG. 8 shows device 500 in a state of partial fabrication, more progressed than illustrated in FIG. 7.

FIG. 8 shows device 500 in a state of partial fabrication, more progressed than illustrated in FIG. 7. FIG. 8 illustrates the addition of emissive layer 545 to subpixel 540, and the addition of emissive layer 555 to subpixel 550, simultaneously and through the same mask 575. As a result, emissive layer 545 and emissive layer 555 have the same composition. Emissive layers 545 and 555 both contain at least a third emitting material. Emissive layers 545 and 555 may also contain other materials that are known for use in an emissive layer, such as a host material, emissive materials in addition to the third emitting material, dopants included to enhance transport properties, sensitivity dopants, and other materials. Emissive layers 545 and 555 may have sublayers. In subpixel 550, emissive layer 555 is deposited over emissive layers 553 and 554, such that there are now three separate emissive layers in subpixel 550, emissive layer 553 that includes the first emissive material, emissive layer 554 that includes the second emissive material, and emissive layer 555 that includes the third emissive material. Emissive layers 553, 554 and 555 may be collectively referred to as a single emissive layer having sublayers.

Figure 9:
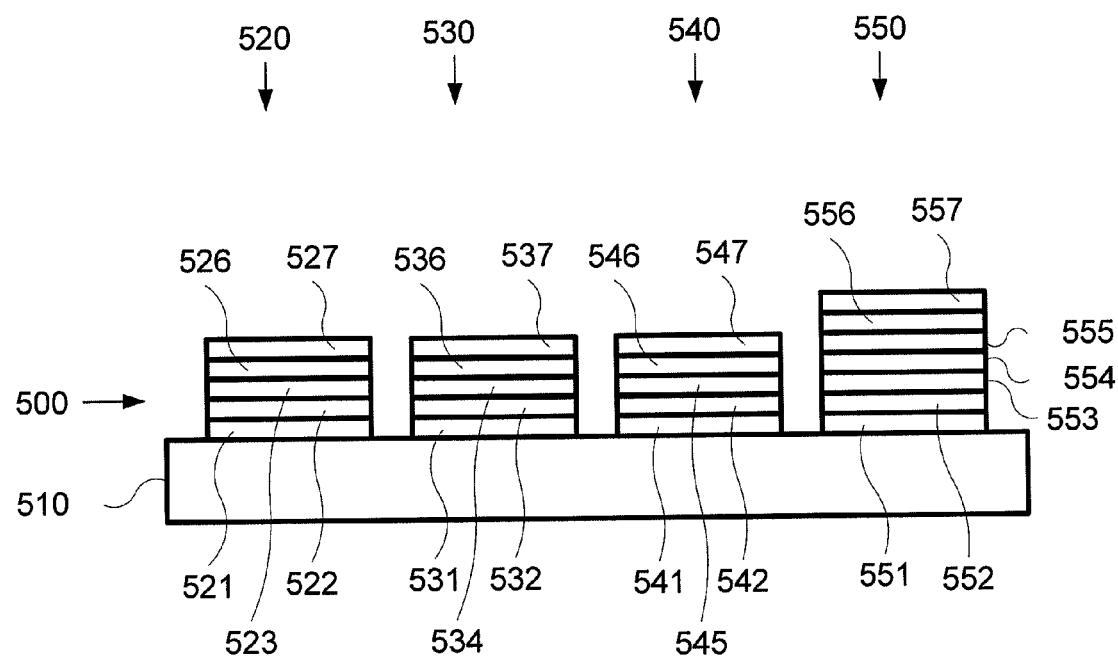
FIG. 9 shows device 500 fully fabricated.

FIG. 9 shows device 500 fully fabricated. It is understood that additional layers may be added, including but not limited to protective layers, encapsulation layers, outcoupling enhancements layers, or other types of layers. FIG. 9 illustrates device 500 after second non-emissive layers 526, 536, 546 and 556, as well as second electrodes 527, 537, 547 and 557 have been added to sub-pixels 520, 530, 540 and 550, respectively. The second electrodes and second non-emissive layers may include any materials, and may be fabricated by any method. The second non-emissive layers are optional. When present, the second non-emissive layers may include one or more different sublayers. In a preferred embodiment, the second electrode is a cathode, and the second non-emissive layers include one or more layers that are known for inclusion in an organic light emitting device between the cathode and the emissive layer. Examples of such layers include an electron injection layer, an electron transport layer, and a hole blocking layer as described in FIG. 1. The second electrode may also be an anode, as described, for example, with respect to FIG. 2, with corresponding adjustments to the second non-emissive organic layers. In a preferred embodiment, all of the second electrodes are fabricated simultaneously by the same method, and have the same composition, and all of the second non-emissive organic layers similarly have the same composition and are fabricated simultaneously. Having all of these layers the same across all subpixels allows for ease of fabrication, although some tradeoffs may need to be made in terms of device optimization as described in more detail below.

FIGS. 5-9 illustrate the fabrication of a device having four sub-pixels, where the first, second and third subpixels include a first, second and third emitting material, respectively, and the fourth subpixel includes all of the first, second and third emitting materials. Other configurations may be readily used as well. For example, the fourth subpixel may include a combination of only two emitting materials from the other subpixels. This may be useful, for example, to create a pixel having red, green, blue and orange (combination of red and green) subpixels. This configuration can be readily achieved by the same process described in FIGS. 5-9, with a slight modification—blocking deposition onto subpixel 550 during one of the steps, such that two but not three of the emitting materials are deposited onto subpixel 550.

Figure 10:
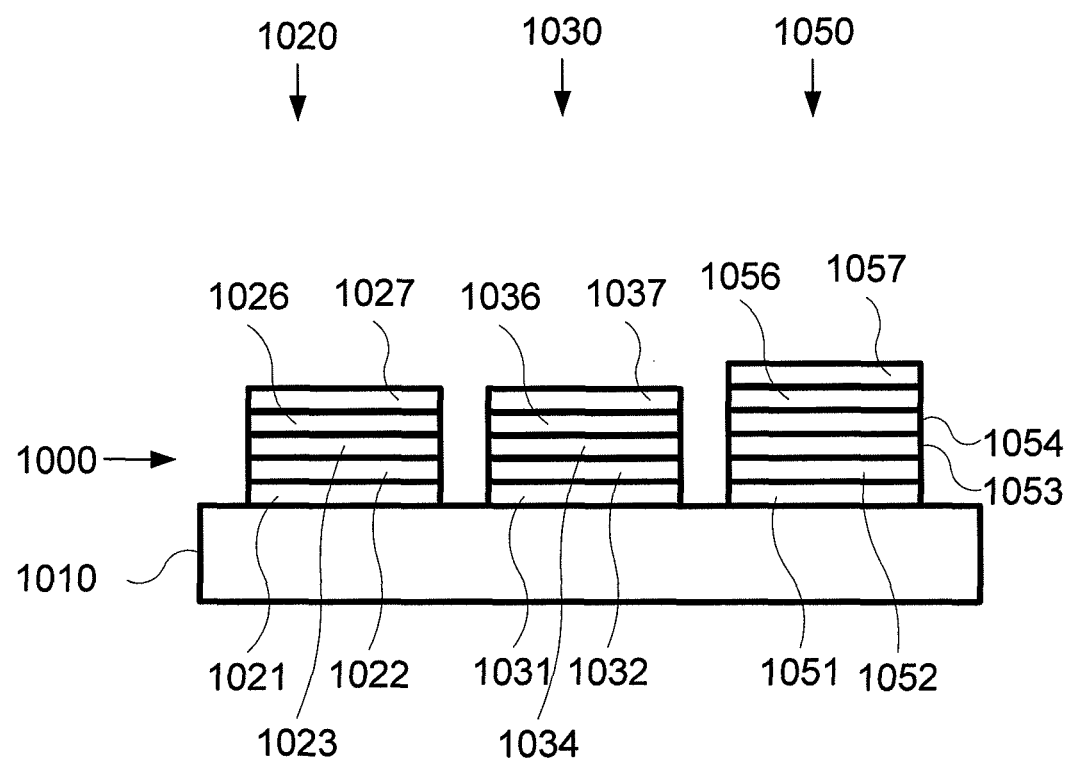
FIG. 10 shows a device 1000. Device 1000 is similar to device 500, but has three subpixels instead of four.

In a more general sense, the method described with respect to FIGS. 5-9 can be generalized to a situation where a total of three subpixels are fabricated, where the first and second subpixels include first and second emitting materials, respectively, and the third subpixel includes both the first and second emitting materials. FIG. 10 illustrates such a device.

FIG. 10 a device 1000 fully fabricated. It is understood that additional layers may be added, including but not limited to protective layers. Device 1000 has three subpixels, specifically first subpixel 1020, second subpixel 1030, and third subpixel 1050. Device 1000 is fabricated on a substrate 1010. Each sub-pixel includes a first electrode and a first non-emissive organic layer. Specifically, devices 1020, 1030, and 1050 include first electrode 1021, 1031 and 1051, and first non-emissive organic layer 1022, 1032, and 1052, respectively. The first electrodes and first non-emissive layers of FIG. 10 are analogous to those of FIG. 5 in terms of composition and manufacturing methods. Device 1020 includes an emissive layer 1023 that includes a first emitting material. Device 1030 includes an emissive layer 1034 that includes a second emitting material. Device 1050 includes an emissive layer having sublayers 1053 and 1054, such that both the first and second emitting materials are present in device 1050. Subpixels 1020, 1030 and 1050 also include second non-emissive layers 1026, 1036, and 1056, and second electrodes 1027, 1037, and 1057, respectively. The second electrodes and second non-emissive layers are analogous to those of FIGS. 5-9 in terms of composition and manufacturing methods.

The first and second emitting materials may be selected to determine the CIE coordinates or peak emissive wavelength of subpixels 1020 and 1030. Subpixel 1050 will have a CIE coordinate falling on the line between the CIE coordinates of subpixels 1020 and 1030, with the possibility of small deviations due to microcavity or other effects that may shift emission spectra.

Device 1000 may be fabricated by a method similar to that described for device 500, but omitting one of the subpixels, such as subpixel 540, and the deposition step in which that subpixel's emitting material is deposited, i.e., the third emitting material described in FIGS. 5-9. Or, a subpixel analogous to subpixel 540 may still be included, but subpixel 1050 may be blocked by the mask when the third emitting material is deposited. This would result in a four-subpixel device, where three of the subpixels have distinct first, second and third emitting materials, and the fourth subpixel has a combination of the first and second emitting materials but not the third.

The structure of device 500 may be useful for fabricating a red, green, blue and white (RGBW) device. The structure of device 1000, plus an additional subpixel as described above, may be useful for fabricating a red, green, blue and orange, or a red, green, blue and light blue device. In each of these situations, a device having four subpixels with distinct emissive spectra may be fabricated with only three patterning steps for the emissive layers.

Those of skill in the art routinely optimize devices through selection of emitting materials, hosts, transport materials, injection materials, layer thicknesses, and other factors. Devices may be optimized for emission spectra, lifetime, efficiency, and other parameters. In many situations, optimization involves trade-offs. For example, in many situations, emission spectra may be adjusted via microcavity effects, but at the loss of efficiency and off-angle viewing properties.

For the architectures described herein, it is desirable to select a common architecture for all layers other than the emissive layers, to minimize fabrication steps. Such an architecture would involve layers that can be deposited simultaneously for all devices, desirably reducing the complexity and cost of fabrication. However, the use of such a common architecture will most likely involve trade-offs, because any optimization is likely to be different for the different devices. In addition, it may be preferred to use a host that is common to all of the emissive layers, because a part of selecting the various layers is how they interact with the host. Again, this will involve trade-offs, because a host optimal for use with one emitting material may not be as well-suited for use with another emitting material. Some embodiments may be practiced without the use of a common architecture, preferably where the advantages of separately optimizing particular layers outweigh the lower cost and complexity of common architecture.

While FIGS. 5-9 illustrate patterning via masks, other patterning methods may be used, such as OVJP and other patterning methods, while still retaining the advantages of fabricating four separate emissive layers with only three patterning steps.

In the simplest case, patterning may be achieved via mask openings, nozzles, or the like, that are similar, and the different parts of the pattern that are deposited at the same time or in the same step have similar thickness and composition. For example, as illustrated in FIG. 6, the addition of emissive layer 523 to subpixel 520, and the addition of emissive layer 553 to subpixel 550, simultaneously and through the same mask 573, may result in emissive layers 523 and 553 having similar thicknesses and composition. However, the thickness of the deposited layers through different openings may be adjusted by altering the nature of the mask. For example, a mask having finer features, such as stripes across the opening having a small dimension, may be used to reduce the amount of material deposited through the opening. The dimensions of the stripes may be lower than the resolution of the deposition technique, such that the stripes do not show up in the deposited pattern, but rather result in the deposition of less material over the entire area of the opening, regardless of the presence of a stripe. Similarly, valves or nozzle geometry may be used such that a similar deposition material may be used in an OVJP deposition step to deposit layers having similar composition but different thickness.

Figure 11:
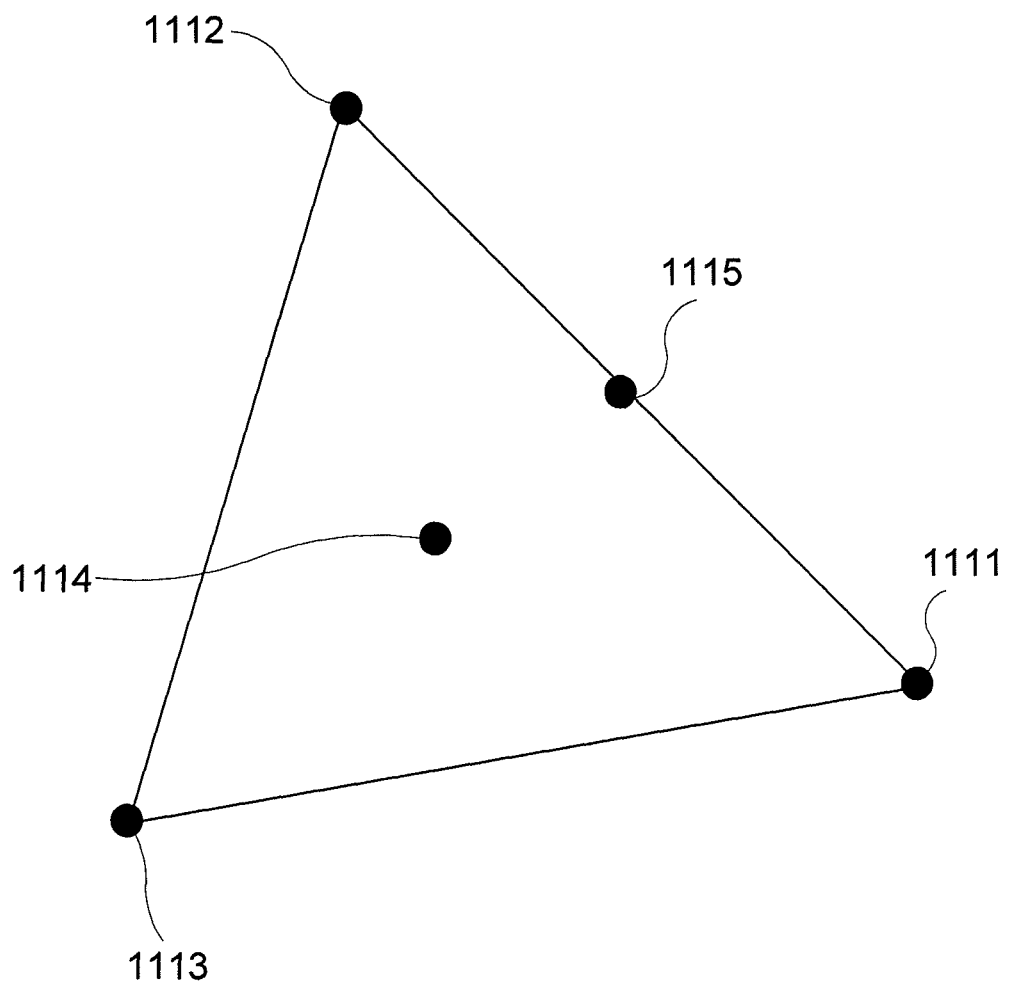
FIG. 11 illustrates, through the use of CIE coordinates, examples of colors that may be emitted by the various sub-pixels of devices such as device 500 and device 1000.

FIG. 11 shows a conceptualization of CIE coordinates, that may be considered in connection with FIGS. 3 and 4. Coordinates 1111, 1112 and 1113 may correspond to a red, green, and blue point in CIE space. A device such as that illustrated in FIG. 9 may be a RGBW device, and may have CIE coordinates corresponding to points 1111, 1112 and 1113 for subpixels 520, 530 and 540, with first, second and third emitting materials, respectively. Subpixel 550 includes first, second and third emitting materials, and may have a CIE coordinate such as coordinate 1114, falling within the triangle defined by coordinates 1111, 1112 and 1113.

A device such as that illustrated by FIG. 10 may have subpixels 1020 and 1030, with first and second emitting materials, respectively, having CIE coordinates corresponding to points 1111 and 1112. Subpixel 1050, which includes both the first and second emitting materials, may have a CIE coordinate such as coordinate 1115, falling on the line between coordinates 1111 and 1112.

Figure 12:
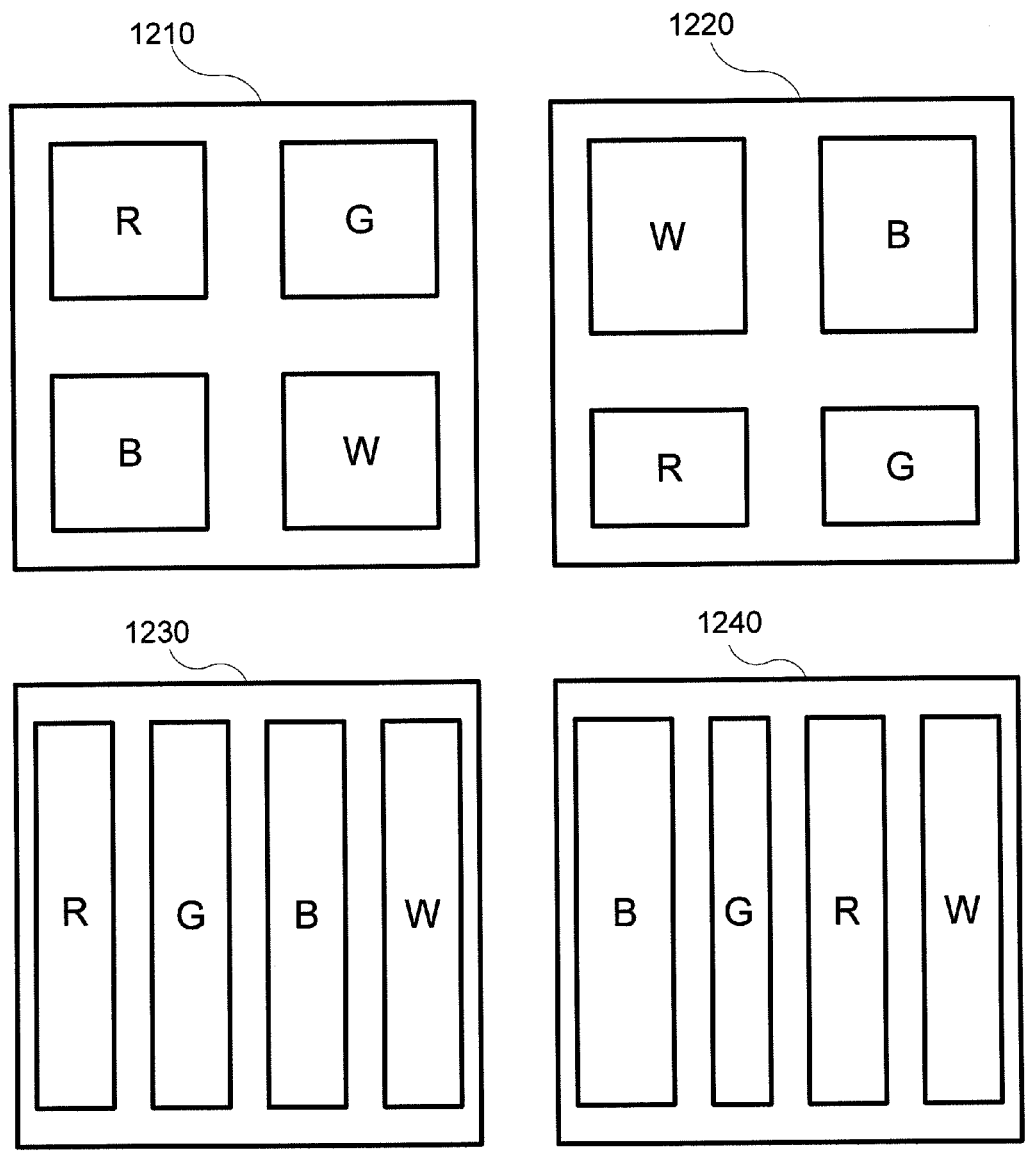
FIG. 12 shows example configurations for a quad pixel.

A device having four different organic light emitting devices, each emitting a different color, may have a number of different configurations. FIG. 12 illustrates some of these configurations. In FIG. 12, R is a red-emitting device, G is a green-emitting device, B is a blue-emitting device, and W is a white-emitting device. Other configurations may also be used.

Configuration 1210 shows a quad configuration, where the four organic light emitting devices making up the overall device or multicolor pixel are arranged in a two by two array. Each of the individual organic light emitting devices in configuration 1210 has the same surface area. In a quad pattern, each pixel could use two gate lines and two data lines.

Configuration 1220 shows a quad configuration where some of the devices have surface areas different from the others. It may be desirable to use different surface areas for a variety of reasons. For example, a device having a larger area may be run at a lower current than a similar device with a smaller area to emit the same amount of light. The lower current may increase device lifetime. Thus, using a relatively larger device is one way to compensate for devices having a lower expected lifetime.

Configuration 1230 shows equally sized devices arranged in a row, and configuration 1240 shows devices arranged in a row where some of the devices have different areas.

Various types of OLEDs may be used to implement various configurations, including transparent OLEDs and flexible OLEDs.

Displays with devices having four sub-pixels, in any of the various configurations illustrated and in other configurations, may be fabricated and patterned using any of a number of conventional techniques. Examples include shadow mask, laser induced thermal imaging (LITI), ink-jet printing, organic vapor jet printing (OVJP), or other OLED patterning technology.

A single pixel may incorporate more than the four subpixels disclosed herein, possibly with more than four discrete colors. However, due to manufacturing concerns, four subpixels per pixel is preferred.

A wide variety of materials may be used for the electrodes, non-emissive and emissive layers of devices fabricated as described herein. Some exemplary materials are disclosed in U.S. Pat. No. 7,279,704, which is incorporated by reference. Some specific examples of devices having one emissive layer, two emissive layers, and three emissive layers, with phosphorescent emitting materials, are described in Table 1. Fluorescent emitters may also be used, but phosphorescent emitters are preferred. Peak wavelength (WL) is provided for devices having a single emitting layer. The devices in Table 1 were not necessarily fabricated at the same time as other devices in Table 1 using the masking techniques described herein, but are provided to illustrate working examples of stacked devices that could be fabricated using the masking techniques described herein:

TABLE 1

Device Structures

| Dev. No. | Color | Device Structure | 1931 CIE at 10 mA/cm$^2$ | Max. luminous efficacy [cd/A] | Peak WL [nm] |
|---|---|---|---|---|---|
| 1 | Green OLED | ITO/CuPc[100A]/NPD[300A]/ CBP:Ir(ppy)$^3$[300A](6%)/ BAlq$_2$[100A]/Alq$_3$[400A]/LiF/Al | 0.30, 0.63 | 23.9 | 518 |
| 2 | Red OLED | ITO/CuPc[100A]/NPD[400A]/ CBP:Compound A[300A](12%)/ BAlq$_2$ [150A]/Alq$_3$ [400A]/ LiF/Al | 0.65, 0.35 | 13.9 | 618 |
| 3 | Green/red OLED | ITO/CuPc[100A]/NPD[300A]/ CBP:Ir(ppy)$^3$[150A](6%)/ CBP:Compound A[150A](6%)/ BAlq$_2$ [150A]/Alq$_3$ [400A]/ LiF/Al | 0.53, 0.44 | 13 | |
| 4 | Red/green OLED | ITO/CuPc[100A]/NPD[300A]/ CBP:Compound A[150A](6%)/ CBP:Ir(ppy)$^3$[150A](6%)/BAlq$_2$ [150A]/Alq$_3$ [400A]/LiF/Al | 0.47, 0.48 | 12.2 | |
| 5 | White OLED | ITO/CuPc[100A]/NPD[300A]/ mCP:Compound B[250A](6%)/ CBP:Compound C[25A](6%)/ CBP:Ir(ppy)$^3$[25A](6%)/BAlq$_2$ [400A]/LiF/Al | 0.35, 0.33 | 31 | |

TABLE 1-continued

Device Structures

| Dev. No. | Color | Device Structure | 1931 CIE at 10 mA/cm² | Max. luminous efficacy [cd/A] | Peak WL [nm] |
|---|---|---|---|---|---|
| 6 | Red OLED | ITO/CuPc[100A]/NPD[500A]/CBP:Compound C[300A](6%)/BAlq₂[150A]/Alq₃[500A]/LiF/Al | 0.61, 0.39 | 18 | 594 |
| 7 | Blue OLED | ITO/CuPc(100A)/NPD[300A]/mCP:Compound B[300A](6%)/BAlq₂[400A]/LiF/Al | 0.14, 0.23 | 12.3 | 460 |
| 8 | White OLED | ITO/NPD[300A]/mCP:Compound D[100A](6%)/mCP:Compound B[175A](6%)/TPBi:Compound A[25A](1.5%)/TPBi[400A]/LiF/Al | 0.34, 0.36 | 25 | |
| 9 | Green OLED | ITO/CuPc[100A]/NPD[300A]/mCP:Compound D[300A](4.5%)/BAlq₂[100A]/Alq₃[40A]/LiF/Al | 0.31, 0.63 | 29 | 518 |

In the table above, compounds are labeled as followed:

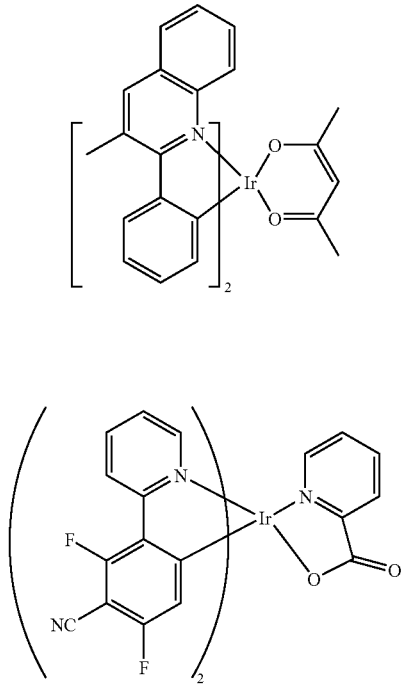

Compound A

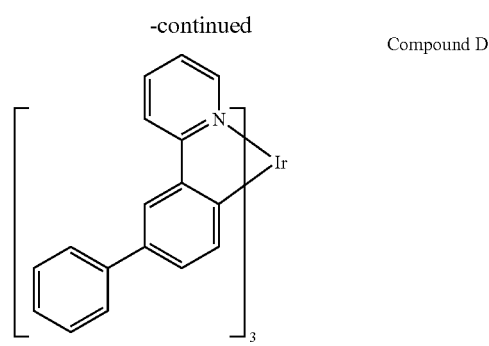

Compound D

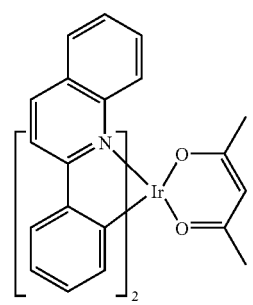

Compound B

Compound C

ITO: indium tin oxide
CuPc: copper phthalocyanine
NPD: N,N'-di(1-naphthyl)-N,N-diphenylbenzidine
CBP: 4,4'-bis(9-carbazolyl)biphenyl
Ir(ppy)³: tris(2-phenylpyridine) iridium (III)
BAlq₂: bis-(2-methyl-8-quinolinolato)-4-(phenyl-phenolato)-aluminum-(III)
Alga: tris(8-hydroxyquinoline) aluminum
mCP: 9,9'-(1,3-phenylene)bis-9H-carbazole
TPBi: 1,3,5-tris-(N-phenylbenzimidazole-2-yl)-benzene It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:
1. A device, comprising:
a first sub-pixel comprising an emissive layer further comprising a first emitting material, wherein a second emitting material is not included in the first sub-pixel;
a second sub-pixel comprising an emissive layer further comprising the second emitting material, wherein the first emitting material is not included in the second sub-pixel;

a third sub-pixel comprising an emissive layer further comprising the first and second emitting materials; and a fourth sub-pixel comprising an emissive layer further comprising a third emitting material, wherein the third sub-pixel comprising an emissive layer further comprising the first, second and third emitting materials.

2. The device of claim 1, wherein
the first sub-pixel emits light having a peak wavelength of 1-500 nm;
the second subpixel emits light having a peak wavelength of 500-600 nm;
the third subpixel emits light having a 1931 CIE coordinate of (x=0.26-0.37, y=0.27-0.38);
the fourth subpixel emits light having a peak wavelength of 600-700 nm.

3. The device of claim 1, wherein the device is incorporated into a display.

4. The device of claim 1, wherein the first, second and third emitting materials are phosphorescent.

5. A device, comprising:
a first sub-pixel comprising an emissive layer further comprising a first emitting material, wherein a second emitting material is not included in the first sub-pixel;
a second sub-pixel comprising an emissive layer further comprising the second emitting material, wherein the first emitting material is not included in the second sub-pixel;
a third sub-pixel comprising an emissive layer further comprising the first and second emitting materials; and
a fourth sub-pixel comprising an emissive layer further comprising a third emitting material,
wherein the third sub-pixel comprising an emissive layer further comprising the first and second emitting materials and not the third emitting material.

6. The device of claim 5, wherein:
the first sub-pixel emits light having a peak wavelength of 400-470 nm;
the second subpixel emits light having a peak wavelength of 500-600 nm;
the third subpixel emits light having a 1931 CIE coordinate of (x=0.10-0.20, y=0.15-0.45);
the fourth subpixel emits light having a peak wavelength of 600-700 nm.

7. The device of claim 5, wherein:
the first sub-pixel emits light having a peak wavelength of 600-700 nm;
the second subpixel emits light having a peak wavelength of 500-600 nm;
the third subpixel emits light having a 1931 CIE coordinate of (x=0.40-0.63, y=0.36-0.55)
the fourth subpixel emits light having a peak wavelength of 400-500 nm.

8. The device of claim 5, wherein the device is incorporated into a display.

9. The device of claim 5, wherein the first, second and third emitting materials are phosphorescent.

10. A method of fabricating a device having four sub-pixels, comprising:
depositing a first electrode layer having a first sub-pixel and a second sub-pixel;
in a first patterned deposition process, depositing a first emitting material on the first sub-pixel and the third sub-pixel, but not the second sub-pixel;
in a second patterned deposition process, depositing a second emitting material on the second sub-pixel and the third sub-pixel, but not the first sub-pixel;
depositing a second electrode layer, wherein at least one of the first and second electrode layers are patterned to define the first, second, third and fourth subpixels; and
in a third patterned deposition process, depositing a third emitting material on the fourth sub-pixel,
wherein the third emitting material is also deposited on the third subpixel.

11. The method of claim 10, wherein a first non-emitting organic layer is deposited after depositing the first electrode layer and before the first and second patterned deposition processes, and wherein a second non-emitting organic layer is deposited after the first and second patterned deposition processes and before depositing the second electrode layer.

12. The method of claim 10, wherein only three patterned deposition processes are used to deposit emitting materials on the first, second, third and fourth subpixels.

13. The method of claim 10, wherein:
the third sub-pixel further comprises the third emitting material;
the first emitting material emits light having a peak wavelength of 400-500 nm;
the second emitting material emits light having a peak wavelength of 500-600 nm;
the combination of emitting materials present in the third subpixel emits light having a 1931 CIE coordinate of (x=0.26-0.37, y=0.27-0.38);
the third emitting material emits light having a peak wavelength of 600-700 nm.

14. The method of claim 10, wherein the method is used to fabricate a display.

15. A method of fabricating a device having four subpixels, comprising:
depositing a first electrode layer having a first sub-pixel and a second sub-pixel;
in a first patterned deposition process, depositing a first emitting material on the first sub-pixel and the third sub-pixel, but not the second sub-pixel;
in a second patterned deposition process, depositing a second emitting material on the second sub-pixel and the third sub-pixel, but not the first sub-pixel;
depositing a second electrode layer, wherein at least one of the first and second electrode layers are patterned to define the first, second, third and fourth subpixels; and
in a third patterned deposition process, depositing a third emitting material on the fourth sub-pixel,
wherein the third emitting material is not deposited on the third subpixel.

16. The method of claim 15, wherein:
the first emitting material emits light having a peak wavelength of 400-470 nm;
the second emitting material emits light having a peak wavelength of 500-600 nm;
the combination of emitting materials present in the third subpixel emits light having a 1931 CIE coordinate of (x=0.10-0.20, y=0.15-0.45);
the third emitting material emits light having a peak wavelength of 600-700 nm.

17. The method of claim 15, wherein:
the first emitting material emits light having a peak wavelength of 600-700 nm;
the second emitting material emits light having a peak wavelength of 500-600 nm;
the combination of emitting materials present in the third subpixel emits light having a 1931 CIE coordinate of (x=0.40-0.63, y=0.36-0.55);
the third emitting material emits light having a peak wavelength of 400-500 nm.

18. The method of claim 15, wherein the method is used to fabricate a display.

* * * * *